United States Patent
Brandon et al.

(10) Patent No.: US 6,410,086 B1
(45) Date of Patent: *Jun. 25, 2002

(54) METHOD FOR FORMING HIGH PERFORMANCE SURFACE COATINGS AND COMPOSITIONS OF SAME

(75) Inventors: David G. Brandon; Ludmilla Cherniak, both of Haifa; Albir A. Layyous, Upper Galilee; Alex Barsky, Maalot; Ron Goldner, Mizpe Adi; Leah Gal-Or, Haifa; Ronen Lanir, Yokeneam; Shay Gilboa, Haifa, all of (IL)

(73) Assignees: Cerel (Ceramic Technologies) Ltd., Tirat Ha Carmel; Iscar Ltd., Tefen, both of (IL)

( * ) Notice: Subject to any disclaimer, the term of this patent is extended or adjusted under 35 U.S.C. 154(b) by 0 days.

This patent is subject to a terminal disclaimer.

(21) Appl. No.: 09/449,958

(22) Filed: Nov. 26, 1999

(51) Int. Cl.[7] .............................. C23C 16/00; C25C 1/12

(52) U.S. Cl. .............................. 427/248.1; 427/255.12; 427/569; 427/586; 204/471; 204/484

(58) Field of Search ........................... 427/249.2, 248.1, 427/569, 596, 255.12, 586; 204/489, 491, 471, 484

(56) References Cited

U.S. PATENT DOCUMENTS

| | | |
|---|---|---|
| 4,988,421 A | 1/1991 | Drawl et al. |
| 5,183,631 A | 2/1993 | Kugimiya et al. |
| 5,628,590 A | 5/1997 | Beeghly et al. |
| 5,879,823 A | 3/1999 | Prizzi et al. |
| 5,882,777 A | 3/1999 | Kukino et al. |
| 5,919,347 A * | 7/1999 | Gal-Or et al. ............... 204/491 |
| 6,127,283 A * | 10/2000 | Gal-Or et al. ............... 204/491 |
| 6,258,237 B1 * | 7/2001 | Gal-Or et al. ............... 204/489 |
| 6,270,642 B1 * | 8/2001 | Basu et al. ............... 204/491 |

OTHER PUBLICATIONS

Sugiyama et al, "Pressure–Pulsed Chemical Vapour Infiltration of TiN to SiC Particulate Preforms", *J. Material Science*, 31:2945–2949, 1996.

Panitz et al, "Properties of Chemical Vapor Infiltration Diamond Deposited in a Diamond Powder Matrix", *J. Vac. Sci. Technol.*, A 12 (4): 1480–1485, 1994.

Konyashin et al, "Plasma–Assisted CVD of Cubic Boron Nitride", *Chem. Vap. Deposition*, 3(5): 239–255, 1997.

Vel et al, "Cubin Boron Nitride: Synthesis, physicochemical Properties and Application", *Materials Science and Engineering*, B10: 149–164, 1991.

Sundberg, K, "Material Advances Push Forward the Cutting Edge", *MPR*, Apr. 1999, pp. 26–29.

Deming et al, "PCBN Turns Gray Cast Iron", *Cutting Tool Engineering*, pp. 84–92, Jun., 1994.

Gardinier, CF, "Physical Properties of Superabrasives", *Ceramic Bulletin*, 67(6): 1006–1009, 1988.

* cited by examiner

*Primary Examiner*—Bret Chen
(74) *Attorney, Agent, or Firm*—G. E. Ehrlich Ltd.

(57) ABSTRACT

A method of forming on an object a surface coating having a high mechanical strength and chemical and physical stability above 700° C. is disclosed. The method comprises (a) electrophoretically depositing at least one surface coating material on a surface of the object for obtaining a green coating on the surface; and (b) infiltrating into and depositing onto the green coating at least one additional surface coating material by a gas-phase infiltration/deposition method, thereby forming a high performance surface coating, wherein, the at least one surface coating material and the at least one additional surface coating material are chemically and physically stable above 700° C.

20 Claims, 1 Drawing Sheet

METHOD FOR FORMING HIGH PERFORMANCE SURFACE COATINGS AND COMPOSITIONS OF SAME

FIELD AND BACKGROUND OF THE INVENTION

The present invention relates to the formation of surface coatings, and more particularly, to a method for forming on an object a high performance surface coating, characterized by high mechanical strength, exhibiting hardness and wear resistance, stability at high temperatures, and resistance to chemical attacks, and to compositions of the high performance surface coatings.

Currently, there is an on-going search for methods for forming surface coatings characterized by high mechanical strength, exhibiting hardness and wear resistance, stability at high temperatures, and resistance to chemical attacks, and for compositions of such surface coatings. High performance surface coatings are necessary for manufacturing objects used in high performance applications, including devices such as instruments, tools, equipment, machines, components of each of these, and work pieces.

There is a wide range of applications for high performance coated objects, each of which involves one or more forms of extensive or high levels of physicochemical phenomena or interactions taking place at or on the coated surface of a given object, involving an object and a work piece, two objects, an object and its local environment, or a combination of these. These forms include mechanical phenomena such as friction, abrasion, and related mechanisms involving hardness and material wear, thermal phenomena such as heat generation, absorption, and transfer, and chemical phenomena such as oxidation, corrosion, or reaction between materials. Applications which use high performance surface coated objects include, for example, devices, components, and work pieces, involving cutting, grinding, milling, drilling, polishing, rotating, or turning, used in a diversity of industries such as mining, metal working, construction, medical and aeronautical applications, and power generation.

High performance applications also include using coated objects such as rotators, ball bearings, gears, pistons, and blades, in larger objects or devices such as generators, motors, and turbines, used for example, in land, sea, and air vehicles such as automobiles, boats, and airplanes, and for example, in electric power stations.

There is an increasing need for objects with high performance surface coatings, both for effecting processes and as components, in the semiconductor, electronics, and electrooptics industries. An example is the manufacture of electronic components having a high performance coated surface, for maintaining functionality during conditions of high levels of heat radiation or heat absorption, used in larger electronic equipment and instrumentation.

In objects having a high performance coated surface, the active region where the extensive physicochemical phenomena or interactions take place is characterized by the volume encompassing the active or coated surface area extending along an edge or contour of the coating and penetrating into the surface coating to a depth usually of less than 250 microns. But the volume extend to a depth of the order of 1000 microns. This can be considered the high performance surface coated region, and is typically composed of at least one layer of one or more coating materials, formed by one or more methods for coating the surface of the object.

Base materials currently used for manufacturing objects used in high performance applications, upon which surface coatings are formed, include (i) metals alloys such as ferrous and non-ferrous alloys, for example, steel or tungsten alloyed with transition group metals such as cobalt or nickel; (ii) metal carbides such as tungsten carbide, titanium carbide, tantalum carbide, or niobium carbide; (iii) metal nitrides such as titanium nitride, tantalum nitride and hafnium nitride; (iv) metal borides such as titanium boride, tantalum boride, and hafnium boride; (v) cemented carbides featuring a metal carbide cemented by one or more transition group metals such as iron, cobalt, and nickel; (vi) oxide and non-oxide ceramics such as alumina or silicon nitride; (vii) cermets or ceramic metal composites featuring a ceramic bonded to a metal such as transition group metals cobalt, nickel, or molybdenum; and (viii) semiconductor materials and oxides such as silicon or silicon dioxide.

Base materials of high performance objects typically include a relatively small concentration of one or more base material strengthening or enhancing agents, where each strengthening or enhancing agent exhibits at least one particular physicochemical property or characteristic, desirably transferable to the base material, in order to improve object properties, function, and/or in service durability. Base material strengthening or enhancing agents include (i) at least one of the above listed base materials to be used in combination with the base material of the object. Additional base material strengthening or enhancing agents include (ii) non-metal carbides such as silicon carbide, (iii) non-metal nitrides such as silicon nitride and boron nitride, and (iv) metal carbide/nitride mixtures such as titanium carbonitride.

For further enhancing mechanical, thermal, and chemical properties and characteristics of a base material of a high performance object, or of a base material, which includes a strengthening or enhancing agent, a coating of usually less than about 250 microns is formed on the surface of the base material of the object. Typical surface coating materials are selected from any of the above listed base materials, base material strengthening agents, or diamond, and applied to a selected base material surface, using specialized methods and procedures.

A wide variety of methods for forming a coating on an object for a high performance application exists. Such methods, including chemical vapor deposition (CVD), plasma chemical vapor deposition (PCVD), plasma assisted chemical vapor deposition (PACVD), chemical vapor infiltration (CVI), laser techniques, and electrophoretic deposition (EPD), the advantages, scope of application, and limitations of each, are well described and taught in the patent literature.

Limitations exist with respect to forming high performance surface coatings on objects to be used in high performance applications. It is of prime importance that the surface coating be mechanically strong exhibiting hardness and wear resistance, and be thermally and chemically durable, as well as adhering to the surface coating substrate. Moreover, it is important for the surface coating to exhibit these same properties and characteristics under working conditions of a given application. These attributes of coated objects are strongly influenced and limited by the coating method, where each method involves the selection of coating parameters such as particular temperatures required for the coating process, geometrical conformation to the shape of a particular substrate, as well as coating thickness, density, uniformity, and adhesion to a base material substrate. Additionally, the rate of coating formation is an important processing parameter when scaling-up a coating method for inclusion into a time dependent production line for the manufacture of a high performance object.

Using any known method for forming a coating on a surface of an object serving as a substrate typically results in attaining several but not all desirable attributes needed for high performance applications. For example, the rate of coating formation may be high, but the coating may be insufficiently dense. Similarly, a coating may be sufficiently thick or dense, yet the coating may not sufficiently adhere to the substrate surface. Additionally, a rapidly formed coating of sufficient thickness and density may not possess the proper combination of physicochemical properties for high performance in service durability, as described below for the case of a thick diamond coating limited by chemical activity at high temperatures. These are significant limitations with respect to current methods for coating objects for use in high performance applications.

Recently, it has been taught in commonly owned, U.S. Pat. No. 6,258,237, that by employing a method combining more than one coating technique, for example, by using EPD for depositing an initial coating on the base material of an object serving as a substrate, followed by using a second coating technique for further enhancing the properties of the initial coating by depositing onto or infiltrating into the initial surface coating, another coating material exhibiting desirable properties and characteristics, several limitations and difficulties for forming thick and uniform coatings can be overcome. In the aforementioned U.S. Pat. No. 6,258, 237, an initial coating is formed on a substrate by electrophoretically depositing positively charged diamond particles on the surface of the substrate, for obtaining a green diamond coating on the surface of the substrate. Following this process, the green diamond particles are consolidated or densified by using another deposition method, such as gas-phase deposition, for example, CVD, chemical deposition, or electrochemical deposition, for depositing a metal throughout interstices of the initial diamond coating, resulting in a thick and uniform diamond layer, adherent to the substrate.

Diamond is commonly known as being the hardest pure material and for exhibiting excellent thermal, electrical, and optical properties. However, there are several limitations in using diamond as a coating material for forming high performance coatings on base material substrate surfaces. For example, diamond coatings are limited to use at temperatures below about 600° C. at which temperature diamond is oxidized. Additionally, diamond coatings are chemically and thermally limited during applications involving contact with alloys based on iron, cobalt, and nickel, to temperatures below about 500° C., due to chemical reaction with these metals and chemical instability in air.

It is known that an alternative to a diamond coating on an object used in high performance applications is based on using cubic boron nitride (cBN) to form a cBN surface coating on such an object. Cubic boron nitride is a notable material, second only to diamond in hardness. Moreover, cBN is stable in air at temperatures up to about 1200° C., in contrast to about 600° C. for diamond, and is chemically stable during contact with common metals, including ferrous and non-ferrous alloys such as hard steels, and nickel and cobalt based alloys. These properties and characteristics of cBN extend the range of its application beyond that of diamond. For example, objects manufactured with a cBN surface coating can readily be used for machining steel, cast iron, and other iron, cobalt, or nickel alloys.

A method of coating a surface of a high performance object with cBN involves compaction of a solid cBN plate by hot pressing the cBN at pressures of about 50,000 atm at a temperature below about 1400° C. and brazing the plate onto the substrate. The sintering procedure is limited as it must be performed in the thermodynamic stability region of cBN in order to prevent conversion of cubic boron nitride into hexagonal boron nitride (hBN). Moreover, this coating technique has additional limitations with respect to forming a uniform and adherent coating on a substrate surface having specialized or intricate geometry or shape.

Chemical vapor deposition methods such as PACVD and PCVD have been employed for coating the surface of an object using cBN, for example, of base material tungsten carbide, but two significant limitations exist using these gas phase deposition methods. First, in strong contrast to forming diamond surface coatings by the same methods, only very thin coatings of cubic boron nitride are obtained. Second, surface coatings thus formed typically feature a multi-phase mixture of amorphous and hexagonal BN, and cBN, at the coating/substrate interface. These multi-phase boron nitride coatings exhibit poor adhesion to the substrate, thus limiting mechanical strength of the coated object during high performance applications.

To one of ordinary skill in the art, there is thus a need for, and it would be highly advantageous to have a method for forming high performance surface coatings characterized by high mechanical strength exhibiting hardness and wear resistance, stability at high temperatures, and resistance to chemical attacks, and to have compositions of high performance surface coatings, which overcome the above indicated limitations associated with forming and using surface coatings for high performance applications.

SUMMARY OF THE INVENTION

The present invention relates to a method for forming on an object a high performance surface coating having high mechanical strength exhibiting hardness and wear resistance, and, high thermal and chemical durabilities, and, to compositions of high performance surface coatings. The method is based on a two step process, uniquely integrating a first step of EPD featuring at least one surface coating material for forming a green coating, with a second step of chemical vapor infiltration/deposition (CVI/D) featuring at least one additional surface coating material, for forming on an object a high performance surface coating characterized by high mechanical strength exhibiting hardness and wear resistance, and, thermal and chemical durabilities.

In selected cases of completing the two step process of EPD followed by CVI/D, an optional third step is performed on the obtained surface coated object. The optional third step is heat treating the obtained surface coated object for the purpose of improving coating adhesion to the substrate, and/or for increasing final density by minimizing porosity of the surface coating.

It is therefore an object of the present invention to provide a method for forming on an object a high performance surface coating having high mechanical strength exhibiting hardness and wear resistance, and, high thermal and chemical durabilities.

It is a further object of the present invention to provide a method for forming on an object a high performance surface coating having high mechanical strength exhibiting hardness and wear resistance, and, high thermal and chemical durabilities, where the method is applicable to different surface coating materials.

It is a further object of the present invention to provide a method for forming on an object a high performance surface coating having high mechanical strength exhibiting hardness and wear resistance, and, high thermal and chemical durabilities, where the method is applicable to different objects featuring different base materials, different base material strengthening or enhancing agents, and different object geometries, shapes, or configurations.

It is another object of the present invention to provide compositions of high performance surface coatings having high mechanical strength exhibiting hardness and wear resistance, and, high thermal and chemical durabilities.

It is a further object of the present invention to provide compositions of high performance surface coatings having high mechanical strength exhibiting hardness and wear resistance, and, high thermal and chemical durabilities, where the compositions feature different surface coating materials.

It is a further object of the present invention to provide compositions of high performance surface coatings having high mechanical strength exhibiting hardness and wear resistance, and, high thermal and chemical durabilities, where the compositions are applicable to different objects featuring different base materials, different base material strengthening or enhancing agents, and different object geometries, shapes, or configurations.

Thus, according to the present invention, there is provided a method for forming on an object a high performance surface coating having high mechanical strength exhibiting hardness and wear resistance, and, high thermal and chemical durabilities, comprising (a) electrophoretically depositing at least one surface coating material on a surface of the object, for obtaining a green coating on the surface of the object; and (b) infiltrating into and depositing onto the green coating at least one additional surface coating material by a gas-phase infiltration/deposition method, thereby forming the high performance surface coating; wherein, at least one of the at least one surface coating material and the at least one additional surface coating material is chemically and physically stable above 800° C.

According to further features in preferred embodiments of the invention described below, the step of infiltrating into and depositing onto the green coating the at least one additional surface coating material by the gas-phase infiltration/deposition method is performed in a temperature range of between about 350° C. to about 1200° C.

According to still further features in the described preferred embodiments, the gas-phase infiltration/deposition method includes chemical vapor infiltration/deposition (CVI/D).

According to still further features in the described preferred embodiments, the method of chemical vapor infiltration/deposition (CVI/D) is selected from the group consisting of non-plasma CVD, plasma assisted CVD (PACVD), and plasma CVD (PCVD).

According to still further features in the described preferred embodiments, the non-plasma CVD is selected from the group consisting of hot wall reactor CVD and laser enhanced CVD.

According to still further features in the described preferred embodiments, the plasma assisted CVD (PACVD) is selected from the group consisting of induction heating PACVD and hot filament PACVD.

According to still further features in the described preferred embodiments, the plasma CVD (PCVD) is selected from the group consisting of DC PCVD, RF induction PCVD and microwave PCVD.

According to still further features in the described preferred embodiments, the step of electrophoretically depositing the at least one surface coating material on the surface of the object includes the step of preparing an EPD suspension including the at least one surface coating material in powdered form, a polar organic liquid, and optionally, at least one additive.

According to still further features in the described preferred embodiments, the at least one additive is selected from the group consisting of a ceramic powder, a pH and conductivity adjusting agent, a charging and surface active dispersing agent, and a binding agent.

According to still further features in the described preferred embodiments, the pH and conductivity adjusting agent is selected from the group consisting of a phosphate ester, acetic acid and hydrochloric acid.

According to still further features in the described preferred embodiments, the charging and surface active dispersing agent is selected from the group consisting of acetylacetone, phosphate ester, and polyacrylic acid.

According to still further features in the described preferred embodiments, the binding agent is selected from the group consisting of menhaden (fish) oil, polyvinyl butyral, polyvinyl alcohol, polyvinyl acid, nitrocellulose and shellac.

According to still further features in the described preferred embodiments, the polar organic liquid is an alcohol.

According to still further features in the described preferred embodiments, the alcohol is selected from the group consisting of ethanol, methanol, and isopropanol.

According to still further features in the described preferred embodiments, the step of electrophoretically depositing the at least one surface coating material on the surface of the object is performed by passing direct electrical current between electrodes of an electrophoretic cell including an EPD suspension featuring the at least one surface coating material, the step of passing the direct electrical current is effected according to a mode selected from the group consisting of constant current and constant voltage.

According to still further features in the described preferred embodiments, each of the at least one surface coating material and each of the at least one additional surface coating material is selected from the group consisting of a high performance base material, a high performance base material strengthening agent, and diamond.

According to still further features in the described preferred embodiments, the surface of the object is selected from the group consisting of a high performance base material and a high performance base material strengthening agent.

According to still further features in the described preferred embodiments, the high performance base material is selected from the group consisting of a metal alloy, a metal carbide, a metal nitride, a metal boride, a cemented carbide, a ceramic, a cermet, and a semiconductor material.

According to still further features in the described preferred embodiments, the high performance base material strengthening agent is selected from the group consisting of a high performance base material, a non-metal carbide, a non-metal nitride, and a metal carbide/nitride mixture.

According to still further features in the described preferred embodiments, the non-metal nitride includes boron nitride of a specific morphologic and crystallographic form, the crystallographic form includes cubic.

According to another aspect of the present invention, there is provided a high performance surface coating having high mechanical strength exhibiting hardness and wear resistance, and, high thermal and chemical durabilities, formed on an object by electrophoretically depositing on a surface of the object at least one surface coating material forming a green coating, followed by infiltrating into and depositing onto the green coating at least one additional surface coating material by a gas-phase infiltration/ deposition method, thereby forming the high performance surface coating, wherein, at least one of the at least one surface coating material and the at least one additional surface coating material is chemically and physically stable above 700° C.

According to another aspect of the present invention, there is provided a high performance surface coating having high mechanical strength exhibiting hardness and wear resistance, and, high thermal and chemical durabilities, comprising an electrophoretically deposited at least one surface coating material, formed as a green coating on a surface of the object, and at least one additional surface coating material infiltrated into and deposited onto the green coating by a gas-phase infiltration/deposition method, the coating materials forming the high performance surface coating, wherein, at least one of the at least one surface coating material and the at least one additional surface coating material is chemically and physically stable above 700° C.

The method for forming on an object a high performance surface coating having high mechanical strength exhibiting hardness and wear resistance, and, high thermal and chemical durabilities, and compositions of high performance surface coatings according to the present invention serve as significant improvements over existing methods for forming surface coatings, and, of surface coating compositions, needed for manufacturing objects used in high performance applications.

With respect to coating processing conditions and parameters, the method of the present invention is generally applicable to a wide variety of high performance base materials of objects and high performance coating materials. The rate of surface coating by EPD followed by infiltration/ deposition is relatively rapid, compared to rates of coating formation in other methods, which is an important consideration when scaling-up a coating method for inclusion into a time dependent production line for the manufacture of a high performance object.

With respect to surface coating quality, properties, and characteristics, a coating thickness of up to at least 100 microns can be formed, where such coatings feature high levels of green density, uniformity, and adhesion to geometrically demanding object shapes and configurations for a variety of widely used high performance base materials. Moreover, coating materials used in the method of the present invention are characterized by being physically and chemically stable above temperatures of 700° C., in contrast to significantly lower temperatures of applicability exhibited by coating materials used in prior art methods, for example, only up to 600° C. for diamond coatings.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings.

DESCRIPTION OF THE PREFERRED EMBODIMENTS

The method of the present invention is based on a two step process, uniquely integrating a first step, EPD process featuring at least one surface coating material for forming a green coating, with a second step, chemical vapor infiltration/deposition (CVI/D) process, featuring at least one additional surface coating material, for forming on an object a high performance surface coating characterized by high mechanical strength and wear resistance, and, thermal and chemical durabilities, and, to compositions of high performance surface coatings.

In selected cases of completing the two step process of EPD followed by CVI/D, an optional third step is performed on the obtained surface coated object. The optional third step is heat treating the obtained surface coated object for the purpose of improving coating adhesion to the substrate, and/or for increasing final density by minimizing porosity of the surface coating.

It is to be understood that the invention is not limited in its application to the details of construction, arrangement, and composition of the components set forth in the following description, drawings, or examples. The invention is capable of other embodiments or of being practiced or adapted in various ways. Also, it is to be understood that the phraseology and terminology employed herein is for the purpose of description and should not be regarded as limiting.

General steps, sub-steps, components, operation, and implementation of the method for forming on an object a high performance surface coating characterized by high mechanical strength exhibiting hardness and wear resistance, and, thermal and chemical durabilities, and to compositions for effecting the same, according to the present invention, are better understood with reference to the following description. Specific examples and accompanying drawings relating to implementing the present invention follow this general description.

For performing the first step of coating an object according to the method of the present invention, in general, any base material used in manufacturing objects for high performance applications, and upon which a surface coating may be formed, including (i) metal alloys such as ferrous and non-ferrous alloys, for example, steel or tungsten alloyed with one or more transition group metals such as cobalt or nickel; (ii) metal carbides such as tungsten carbide, titanium carbide, tantalum carbide, or niobium carbide; (iii) metal nitrides such as titanium nitride, tantalum nitride and hafnium nitride; (iv) metal borides such as titanium boride, tantalum boride, and hafnium boride; (v) cemented carbides featuring a metal carbide cemented by one or more transition group metals such as iron, cobalt, and nickel; (vi) oxide and non-oxide ceramics such as alumina or silicon nitride; (vii) cermets or ceramic metal composites featuring a ceramic bonded to a metal such as transition group metals cobalt, nickel, or molybdenum; and (viii) semiconductor materials and oxides such as silicon or silicon dioxide, having a simple or an intricate surface geometry, shape, or configuration, can be used as a substrate for forming an EPD green coating, featuring at least one surface coating material, having a thickness of up to several hundred microns.

In general, the selected base material may include a relatively small concentration of one or more base material strengthening or enhancing agents, where each strengthening or enhancing agent exhibits one or more particular physicochemical properties or characteristics, desirably transferable to the base material, in order to improve object properties, function, and/or in service durability. Base material strengthening or enhancing agents include (i) at least one of the above listed base materials to be used in combination with the base material of the object. Additional base material strengthening or enhancing agents include (ii) non-metal carbides such as silicon carbide, (iii) non-metal nitrides such as silicon nitride and boron nitride, and (iv) metal carbide/nitride mixtures such as titanium carbonitride.

In general, at least one surface coating material for forming the EPD green coating on the selected base material of the object serving as substrate, is selected from a group including any of the above listed base materials (i) through (viii), base material strengthening or enhancing agents (i) through (iv), and diamond.

To improve the quality of the electrophoretically deposited at least one surface coating material, a green coating additive such as a ceramic powder, for example, alumina, zirconia, or titania, is mixed with the selected surface coating material(s) during preparation of the EPD suspension.

For performing the second step of coating an object according to the method, following EPD of at least one surface coating material, the green coated substrate is dried and subjected to a controlled process of CVI/D of at least one additional surface coating material. In general, at least one additional surface coating material is selected from the same general group used for selecting at least one surface coating material for forming the EPD green coating, which is the group including any of the above listed base materials (i) through (viii), base material strengthening or enhancing agents (i) through (iv), and diamond. Preferably, additional surface coating materials are selected from a group including a metal carbide, a metal nitride, a metal boride, a metal carbonitride, and an oxide such as aluminum oxide. The resultant high performance surface coating is characterized by high mechanical strength, exhibiting hardness and wear resistance, stability at high temperatures, and resistance to chemical attacks, is of a commercially applicable thickness of up to several hundreds of microns, adheres well to the base material substrate, and conforms geometrically to the shape of the object.

For achieving a surface coating characterized by high mechanical strength, the method of the present invention features integrating a second coating step of chemical infiltration/deposition of at least one additional coating material, to fill the interstices between particles of the EPD green coating on the base material substrate surface with the same or other coating materials, and for enabling in-depth infiltration and penetration of the same or other additional coating materials into sub-surface layers of the EPD green coating, thereby, significantly strengthening and enhancing coating properties and characteristics, as demanded by high performance applications.

In Step 1 of the method of the present invention, there is electrophoretic deposition of at least one surface coating material, in powdered form, as a green body coating onto the surface of an object featuring a base material serving as the substrate. An EPD suspension is prepared by dispersing at least one surface coating material in a powdered form, each surface coating material being of a particle size preferably less than about 50 microns, and of concentration in the range between about 0.1% and about 50% by weight, defined as weight of surface coating material particles to weight of EPD suspension, in a polar solvent such as an alcohol, for example, ethanol, methanol, and isopropanol, preferably ethanol. Additionally, a ceramic powder green coating additive such as alumina, zirconia, or titania, in a concentration range of between about 1% and about 50% by weight, defined as weight of ceramic powder to weight of EPD suspension, may be included in the EPD suspension.

For the EPD process of forming the green coating on the substrate surface, particles of each of the at least one surface coating material are charged, in which case they are deposited onto one of the electrodes, for example, the deposition electrode of the EPD cell.

One or more EPD additives such as pH and conductivity adjustment/stabilization agents, charging and surface active dispersing agents, and binding agents are added to the EPD suspension. Preferred pH and conductivity adjustment/stabilization agents are phosphate ester, acetic acid, and hydrochloric acid. It was determined that these and similar agents enable control of pH and conductivity of EPD suspensions featuring at least one surface coating material, resulting in high quality deposition of a green coating being dense, smooth and uniform. Preferred charging and surface active dispersing agents are acetylacetone and phosphate ester for cathodic deposition, and polyacrylic acid for anodic deposition. Preferred binding agents are menhaden (fish) oil, polyvinyl butyral, polyvinyl alcohol, polyvinyl acid, nitrocellulose, and shellac. These binders were found to increase the green strength of the deposited coating.

To achieve the necessary, preferably positive, surface charge on the surface coating material particles, the EPD suspension is subjected to ultrasound agitation in the range of between about 5 to about 20 kHz, at a power level in the range of between about 100 to about 550 watts, for a duration in the range of between about 1 minute to about 30 minutes.

The principle criteria for selecting electrode materials for the EPD cell include chemical stability under EPD process conditions, and inhibition of hydrogen gas evolution. Hydrogen gas evolution at the cathode decreases the density and uniformity of a deposited green coating. For deposition of positively charged surface coating particles onto a cathodic substrate, the anode material preferably features a noble metal such as palladium, platinum, or gold.

The cathode and anode are immersed into the EPD suspension, and a direct current is passed between the electrodes. Deposition is generally performed at either constant current density in a preferred range of between about 0.05 mA/cm$^2$ to about 5 mA/cm$^2$, or at constant voltage in a preferred range of between about 20 volts to about 500 volts. Typical deposition times are in the range of between about a few seconds to about ten minutes. Actual deposition processing conditions depend upon suspension composition, and, upon EPD cell and electrode geometries, as well as upon desired coating characteristics such as thickness, green density, and uniformity. Following EPD of the at least one surface coating material, the green coated substrate is dried in a controlled environment.

In Step 2, the electrophoretically deposited green coating is further densified, strengthened, and improved in its adhesion to the substrate, by subjecting it to a controlled process of gas phase chemical infiltration/deposition of at least one additional surface coating material, optionally including one or more strengthening or enhancing agents preferably selected from a group including a metal carbide such as titanium carbide (TiC), a metal nitride such as titanium nitride (TiN), a metal boride such as titanium boride (TiB), a metal carbonitride such as titanium carbonitride (TiCN), and a hard oxide such as aluminum oxide ($Al_2O_3$).

For the infiltration/deposition process, the green coated substrate is loaded into a reactor. The reactor is first evacuated and flushed with a protective gas such as hydrogen or nitrogen. The reactor and reactor contents are then heated to a selected chemical infiltration/deposition temperature, preferably in the range of between about 350° C. to about 1200° C. Carrier and reactive or coating material gases required to effect the infiltration/deposition process are supplied under controlled reactor conditions of pressure and temperature.

The required gas and substrate temperatures before and during chemical infiltration/deposition of the EDP green coating are achieved through one of two alternative preferred embodiments. The first preferred embodiment features using a standard CVD hot wall reactor, whereas the second preferred embodiment features heating under plasma conditions, by plasma assisted chemical vapor deposition (PACVD), or by induction heating such as by a hot filament or by microwave inductive heating.

Infiltration/deposition from the gas phase of at least one additional surface coating material, for example, TiN, TiC, TiCN, and/or $Al_2O_3$, into and on the green coating, is preferably performed separately, for example, such that an additional coating of TiN is followed by sequential additional coatings of TiC, TiCN, and $Al_2O_3$. The infiltration/deposition process is not limited to a specific order of the coatings. For hard metal substrates, the preferred order of additional coating is TiN, TiC, TiCN, $Al_2O_3$.

Conditions for infiltration/deposition of gas phase exemplary additional surface coating material, TiN, into and on the EPD green coating include a pressure in the range between about 1 mBar and about 900 mBar, preferably about 80 mBar, and a temperature in the range between about 350° C. and about 1200° C., preferably about 900° C. A gas flow rate for $H_2$ is in the range between about 1 L/min and about 25 L/min, preferably about 13 L/min, a gas flow rate for $TiCi_4$ is in the range between about 0.5 ml/min and about 6 ml/min, preferably about 3 ml/min, and a gas flow rate for $N_2$ is in the range between about 0.5 L/min and about 13 L/min, preferably 3 L/min.

Conditions for infiltration/deposition of gas phase exemplary additional surface coating material, TiC, into and on the EPD green coating include a pressure in the range between about 1 mBar and about 900 mBar, preferably 50 mBar, and a temperature in the range between about 350° C. and about 1200° C., preferably 1000° C. A gas flow rate for $H_2$ is in the range between about 1 L/min and about 25 L/min, preferably 15 L/min, and a gas flow rate for $TiCl_4$ is in the range between about 0.5 ml/min and about 6 ml/min, preferably 2.5 ml/min.

Conditions for infiltration/deposition of gas phase exemplary additional surface coating material, TiCN, into and on the EPD green coating include a pressure in the range between about 1 mBar and about 1000 mBar, preferably 80 mBar, and a temperature in the range between about 350° C. and about 1200° C., preferably 970° C. A gas flow rate for $H_2$ is in the range between about 1 L/min and about 50 L/min, preferably 25 L/min, a gas flow rate for $TiCl_4$ is in the range between about 0.5 ml/min and about 9 ml/min, preferably 6 ml/min, and a gas flow rate for $N_2$ is in the range between about 1 L/min and about 50 L/min, preferably 20 L/min.

Conditions for infiltration/deposition of gas phase of exemplary additional surface coating material, $Al_2O_3$, into and on the EPD green coating include a pressure in the range between about 1 mBar and about 900 mBar, preferably 65 mBar, and a temperature in the range between about 350° C. and about 1200° C., preferably 1000° C. A gas flow rate for $H_2$ is in the range between about 1 L/min and about 50 L/min, preferably 40 L/min, a gas flow rate for HCl is in the range between about 0.5 L/min and about 10 L/min, preferably 4 L/min, a gas flow rate for $CO_2$ is in the range between about 0.5 L/min and about 6 L/min, preferably 6 L/min, and a gas flow rate for $H_2S$ is in the range between about 10 ml/min and about 400 cc/min, preferably 150 cc/min.

Following completion of the infiltration/deposition process, the reactor and reactor contents are allowed to cool to room temperature in an atmosphere of a protective gas, such as hydrogen or nitrogen.

In selected cases of completing the two step process of EPD followed by CVI/D, an optional third step is performed on the surface coated object. In optional Step 3, there is heat treating the surface coated object for the purpose of improving coating adhesion to the substrate, and/or for increasing final density by minimizing porosity of the surface coating. Conditions of the heat treatment include heating the surface coated object in the temperature range of 1000–1600° C., preferably 1300° C., for 5 min to 20 hrs, preferably for one hour, under vacuum conditions or in a protective atmosphere of an inert gas, such as argon or nitrogen, at a pressure from about 1 torr up to about 20 atm, preferably at 10 atm.

Additional objects, advantages, and novel features of the present invention will become apparent to one ordinarily skilled in the art upon examination of the following examples, which are not intended to be limiting. Additionally, each of the various embodiments and aspects of the present invention as delineated herein above and as claimed in the claims section below finds experimental support in the following examples.

EXAMPLES

Reference is now made to the following examples, which together with the above descriptions, illustrate the invention in a non-limiting fashion. The examples feature EPD coating an object with an exemplary base material serving as a substrate, for example, a tungsten cobalt alloy base material, with an exemplary surface coating material, for example, cubic boron nitride (cBN) powder. As described above, cubic boron nitride is a notable coating material, being second only to diamond in hardness. Moreover, cBN is an excellent material for inclusion in high performance coatings as it is stable in air at elevated temperatures, up to about 1200° C. in contrast to about 600° C. for diamond, and is chemically inert in contact with hard steels, and nickel and cobalt alloys. These properties and characteristics of cBN extend its range of application beyond that of diamond. For example, by using cBN in an EPD green coating, the subsequently formed high performance surface coating is applicable to objects used for machining steel, cast iron, and other iron, cobalt, or nickel alloys.

To improve the quality of the electrophoretically deposited cBN surface coating material and its adhesion to the substrate, an exemplary EPD green coating strengthening agent such as a ceramic powder, in these examples, alumina, is mixed with the surface coating material, cBN powder, during preparation of the EPD suspension.

In the EPD suspension featuring surface coating material cBN particles, preferred pH and conductivity adjusting agents are phosphate ester, acetic acid and hydrochloric acid. Preferred charging and dispersing agents are acetylacetone and phosphate ester for cathodic deposition, and polyacrylic acid for anodic deposition, which have been found to effectively disperse cBN particles in an EPD suspension, enabling deposition of a dense coating with a smooth and uniform surface. Preferred binding agents are menhaden (fish) oil, polyvinyl butyral, nitrocellulose, and shellac. These binders were found to increase the green strength of the deposited coating.

Preferably, the cBN particles are positively charged, to be deposited onto the cathode, whereby the anode material preferably features a noble metal such as palladium, platinum, or gold.

Following EPD of surface coating material, cBN, the green coated substrate is densified, strengthened, and improved in its adhesion to the substrate by subjecting it to a controlled process of CVI/D of at least one additional surface coating material, preferably selected from the above lists of strengthening agents including a metal nitride such as titanium nitride (TiN), a metal carbide such as titanium carbide (TiC), a metal carbonitride such as titanium carbonitride (TiCN), and a hard oxide such as aluminum oxide ($Al_2O_3$).

The resultant high performance surface coating is characterized by high mechanical strength, exhibiting hardness and wear resistance, stability at high temperatures, and resistance to chemical attacks, is of a common applicable thickness of up to several hundreds of microns, adheres strongly to the base material of the object serving as the substrate, and geometrically conforms to the shape of the object.

Example 1

An EPD suspension was prepared by dispersing 5 grams of a surface coating material of cubic boron nitride, in a powder form of a particle size in the range between 1 and 3 microns, and 0.05 gram of a strengthening agent $Al_2O_3$, in a powder form of a particle size of 0.5 micron, in 1000 mL of pure ethanol. About 150 microliters of acetylacetone dispersant per 100 mL EPD suspension were added to the EPD suspension. The EPD suspension was subjected to an ultrasound treatment for about 10 minutes. About 0.2% by volume of polyvinyl butyral binder was added to the EPD suspension. Sufficient phosphate ester was added to the EPD suspension to adjust the pH of the EPD suspension in the range of about 3 to 4, and to adjust the conductivity of the EPD suspension to about 2 to 3 micro-S/cm. The EPD suspension was then transferred to an electrophoretic cell.

The cathode, or deposition electrode, was a tungsten carbide base material object serving as the substrate. The electrophoretic cell was equipped with a cylindrical palladium anode of about 40 mm in diameter. The cathode was placed inside the electrophoretic cell at the center of the cylindrical anode, and a direct electrical current having a constant current density of about 0.1 $mA/cm^2$ was applied between the electrodes for 30 seconds. The cBN coated substrate was removed from the cell, and dried in a dessicator for a few minutes. The EPD process formed a cBN green coating having a thickness of about 20 microns. The green coating had a green density of at least 50% of theoretical, and the density was highly uniform throughout the entire coating thickness.

The cBN surface coated object was loaded into a CVD hot wall reactor for performing the second coating step of TiN infiltration/deposition under controlled conditions. TiN infiltration/deposition process conditions included a pressure of 80 mBar, a temperature of 900° C., an $H_2$ flow rate of 13 L/min, a $TiCl_4$ flow rate of 3 cc/min, and an $N_2$ flow rate of 3 L/min.

Figure 1:
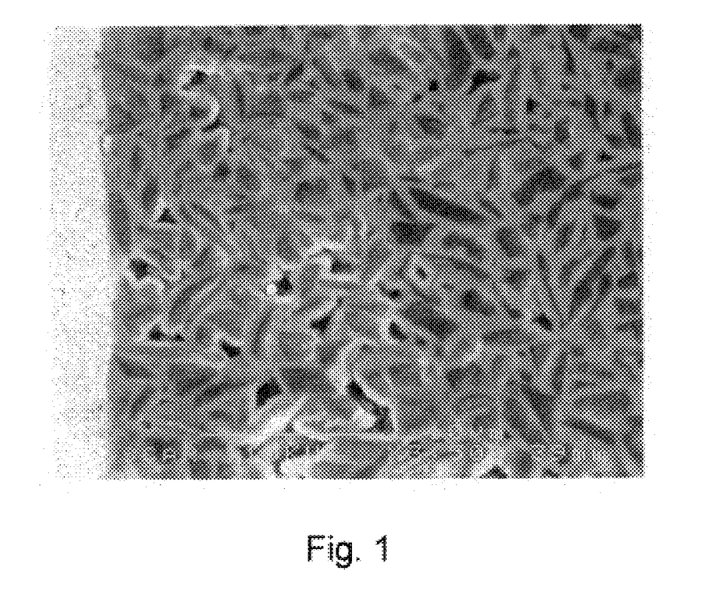
FIG. 1 is an illustration of exemplary EPD formed cBN surface coating on a hard metal substrate, formed according to the method described in Example 1, whereby the additional surface coating material is CVI/D deposited TiN.

The high performance cBN surface coating, strengthened and enhanced with additional surface coating material TiN, was characterized by scanning electron and optical microscopy. FIG. 1 is an illustration of the EPD formed cBN surface coating on a hard metal substrate, formed according to the method described in this example, whereby the additional surface coating material is CVI/D deposited TiN.

Example 2

An EPD suspension was prepared by dispersing 10 grams of a surface coating material of cubic boron nitride, in a powder form of a particle size in the range of 4 to 8 microns, and 1 gram of a strengthening agent $Al_2O_3$, in a powder form of a particle size of 0.5 micron, in 1000 mL of pure ethanol. About 150 microliters of acetylacetone were added as a dispersing agent, per 100 mL EPD suspension. The EPD suspension was subjected to an ultrasound treatment for about 10 minutes. About 0.2% by volume of polyvinyl butyral binder was added to the EPD suspension. Sufficient phosphate ester was added to the EPD suspension to ensure that the pH of the EPD suspension was in the range of about 3 to 4, and to adjust the conductivity of the EPD suspension to about 2 to 3 micro-S/cm. The EPD suspension was then transferred to an electrophoretic cell.

The cathode, or deposition electrode, was a tungsten carbide base material object serving as substrate. The electrophoretic cell was equipped with a cylindrical palladium anode 40 mm in diameter. The cathode was placed inside the electrophoretic cell at the geometrical center of the cylindrical anode, and a direct electrical current was applied at a constant voltage of about 200 volts between the electrodes for 15 seconds. The EPD process formed on the object a cBN green coating having thickness of about 30 microns. The cBN coated object was removed from the cell, and dried in a dessicator for a few minutes. The green coating had an average green density of about 50% of theoretical.

The cBN coated object was loaded into a CVD hot wall reactor for performing the second coating step of TiN infiltration/deposition under controlled conditions. TiN infiltration/deposition process conditions included a gas pressure of 80 mBar, a gas temperature of 870° C., an $H_2$ flow rate of 13 L/min, a $TiCl_4$ flow rate of 3 cc/min, and an $N_2$ flow rate of 3 L/min.

The high performance cBN surface coating, strengthened and enhanced with additional surface coating material TiN, was characterized by scanning electron and optical microscopy and, adhesion tested.

Example 3

An EPD suspension was prepared by dispersing 10 grams of a surface coating material of diamond in a powder form of a particle size in the range of 2–4 microns, in 1000 mL of isopropanol. The suspension was sonicated for seven minutes. Subsequent to cooling of the suspension, 5.4 mg of iodine, 2 mL of acetone, and 1 mL of ionized water were gradually added to the EPD suspension. After 24 hrs, the suspension was sonicated again for 4 min. Deposition of the diamond particles on the cathode was carried out at a constant voltage of 20 volts. The distance between the electrodes was 25 mm. For a deposition time of 30 seconds, a deposit of 25 microns thickness was obtained.

The cathode or deposition electrode was a tungsten carbide base material serving as the substrate. The electrophoretic cell with a volume of 100 mL was equipped with a cylindrical nickel anode. The cathode was placed inside the electrophoretic cell at the geometrical center of the cylindrical anode. The coated object was removed from the cell, and dried in a dessicator for a few minutes. The green coating had an average green density of about 50% of theoretical.

Figure 2:
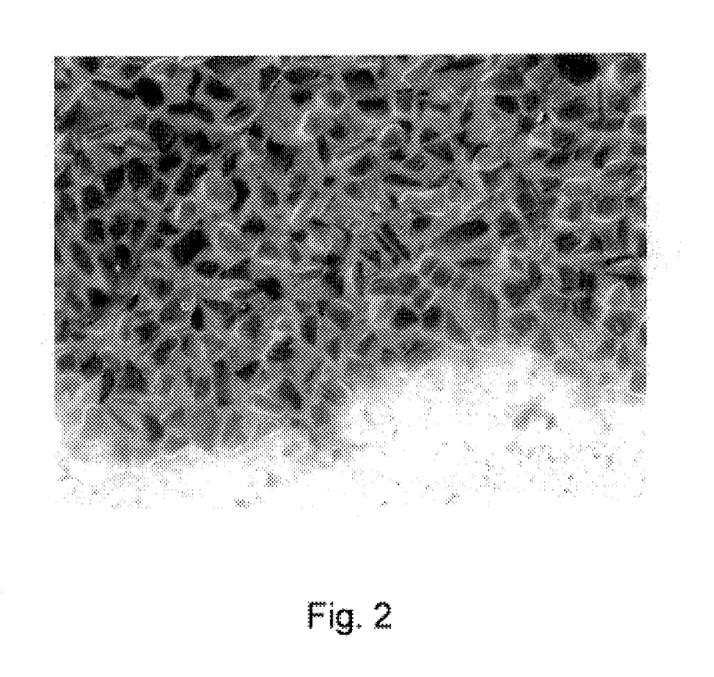
FIG. 2 is an illustration of exemplary EPD formed diamond surface coating on a hard metal substrate, formed according to the method described in Example 3, whereby the additional surface coating material is CVI/D deposited TiN.

The diamond coated object was loaded into a CVD hot wall reactor for performing the second coating step of TiN infiltration/deposition under controlled conditions. TiN infiltration/deposition process conditions included a gas pressure of 80 mBar, a gas temperature of 870° C., an $H_2$ flow rate of 13 L/min, a $TiCl_4$ flow rate of 3 mL/min, and an $N_2$ flow rate of 3 L/min. FIG. 2 is an illustration of the EPD formed diamond surface coating on a hard metal substrate, formed according to the method described in this example, whereby the additional surface coating material is CVI/D deposited TiN.

The coating processing conditions and parameters described in the preceding examples of the method of the present invention are generally applicable to a wide variety of high performance base materials of objects, base material strengthening or enhancing agents, and surface coating materials, and enable using surface coating infiltration/deposition process temperatures well below 900° C., in contrast to other methods such as sintering requiring surface coating process temperatures above 1000° C., which is problematic for many coating materials such as boron nitride which undergoes a phase change from cubic BN to hexagonal BN at the sintering temperatures. Furthermore, the rate of coating formation via EPD followed by infiltration/deposition is rapid, given the high quality of the finished coating and compared to rates of coating formation by other methods, which is an important industrial consideration when scaling-up a coating method for inclusion into a production line for the manufacture of a high performance object.

With respect to surface coating qualities, properties, and characteristics, coating thickness of up at least 100 microns is achievable, where a coating features high levels of green density, uniformity, and adhesion to geometrically demanding object shapes and configurations of a variety of widely used high performance base materials. Moreover, coating materials used in the method of the present invention are characterized by being physically and chemically stable above temperatures of 800° C., in contrast to significantly lower maximum temperatures of applicability exhibited by coating materials used in prior art methods, for example, only up to 600° C. for diamond coating material.

While the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. A method for forming on an object a high performance surface coating having high mechanical strength exhibiting hardness and wear resistance, and, high thermal and chemical durabilities, the method comprising the steps of:
    (a) electrophoretically depositing at least one surface coating material on a surface of the object for obtaining a green coating on said surface of the object; and
    (b) infiltrating into and depositing onto said green coating at least one additional surface coating material by a gas-phase infiltration/deposition method, thereby forming the high performance surface coating;
    wherein, at least one of said at least one surface coating material and said at least one additional surface coating material is chemically and physically stable above 700° C.

2. The method of claim 1, wherein said step of infiltrating into and depositing onto said green coating said at least one additional surface coating material by said gas-phase infiltration/deposition method is performed in a temperature range of between about 350° C. to about 1200° C.

3. The method of claim 1, wherein said gas-phase infiltration/deposition method includes chemical vapor infiltration/deposition (CVI/D).

4. The method of claim 3, wherein said method of chemical vapor infiltration/deposition (CVI/D) is selected from the group consisting of non-plasma CVD, plasma assisted CVD (PACVD), and plasma CVD (PCVD).

5. The method of claim 4, wherein said non-plasma CVD is selected from the group consisting of hot wall reactor CVD and laser enhanced CVD.

6. The method of claim 4, wherein said plasma assisted CVD (PACVD) is selected from the group consisting of induction heating PACVD and hot filament PACVD.

7. The method of claim 4, wherein said plasma CVD (PCVD) is selected from the group consisting of DC PCVD, RF induction PCVD and microwave PCVD.

8. The method of claim 1, wherein said step of electrophoretically depositing said at least one surface coating material on said surface of the object includes the step of preparing an EPD suspension including said at least one surface coating material in powdered form, a polar organic liquid, and optionally, at least one additive.

9. The method of claim 8, wherein said at least one additive is selected from the group consisting of a ceramic powder, a pH and conductivity adjusting agent, a charging and surface active dispersing agent, and a binding agent.

10. The method of claim 9, wherein said pH and conductivity adjusting agent is selected from the group consisting of a phosphate ester, acetic acid, and hydrochloric acid.

11. The method of claim 9, wherein said charging and surface active dispersing agent is selected from the group consisting of acetylacetone, phosphate ester, and polyacrylic acid.

12. The method of claim 9, wherein said binding agent is selected from the group consisting of menhaden (fish) oil, polyvinyl butyral, polyvinyl alcohol, polyvinyl acid, nitrocellulose, and shellac.

13. The method of claim 8, wherein said polar organic liquid is an alcohol.

14. The method of claim 13, wherein said alcohol is selected from the group consisting of ethanol, methanol, and isopropanol.

15. The method of claim 1, wherein said step of electrophoretically depositing said at least one surface coating material on said surface of the object is performed by passing direct electrical current between electrodes of an electrophoretic cell including an EPD suspension featuring said at least one surface coating material, said step of passing said direct electrical current is effected according to a mode selected from the group consisting of constant current and constant voltage.

16. The method of claim 1, wherein each of said at least one surface coating material and each of said at least one additional surface coating material is selected from the group consisting of a high performance base material, a high performance base material strengthening agent, and diamond.

17. The method of claim 1 wherein said surface of the object is selected from the group consisting of a high performance base material and a high performance base material strengthening agent.

18. The method of claim 17, wherein said high performance base material is selected from the group consisting of a metal alloy, a metal carbide, a metal nitride, a metal boride, a cemented carbide, a ceramic, a cermet, and a semiconductor material.

19. The method of claim 17, wherein said high performance base material strengthening agent is selected from the group consisting of a said high performance base material, a non-metal carbide, a non-metal nitride, and a metal carbide/nitride mixture.

20. The method of claim 19, wherein said non-metal nitride includes boron nitride of a specific morphologic and crystallographic form, said crystallographic form includes cubic.

* * * * *